United States Patent
Sobel et al.

(10) Patent No.: US 6,985,084 B2
(45) Date of Patent: Jan. 10, 2006

(54) VISUAL INDICATION EQUIPMENT OPERATION

(75) Inventors: Jay Richard Sobel, Nepean (CA); Steven Daniel Armstrong, Stittsville (CA)

(73) Assignee: Alcatel Canada Inc., Kanata (CA)

( * ) Notice: Subject to any disclaimer, the term of this patent is extended or adjusted under 35 U.S.C. 154(b) by 550 days.

(21) Appl. No.: 10/015,794

(22) Filed: Dec. 17, 2001

(65) Prior Publication Data

US 2003/0112146 A1 Jun. 19, 2003

(51) Int. Cl.
*G08B 21/00* (2006.01)

(52) U.S. Cl. .................. 340/664; 340/635; 340/636.13; 340/636.16; 340/643; 340/644; 340/653; 340/654; 340/662; 340/663; 340/979

(58) Field of Classification Search ................ 340/664, 340/635, 636.13, 636.16, 643, 644, 653, 340/654, 662, 663, 679
See application file for complete search history.

(56) References Cited

U.S. PATENT DOCUMENTS

| 4,071,714 A | * | 1/1978 | Satoh ......................... 375/377 |
| 6,499,353 B1 | * | 12/2002 | Douglas et al. ............... 73/722 |
| 6,657,351 B2 | * | 12/2003 | Chen et al. .................. 310/171 |

* cited by examiner

*Primary Examiner*—Tai T. Nguyen
(74) *Attorney, Agent, or Firm*—Mccarthy Tétrault LLP

(57) ABSTRACT

An electrically operated equipment with a sealed enclosure containing circuitry with an exterior visual indicator to show a state of operation of the equipment. The visual indicator is illuminated by a magnetic flux sensor also exterior to the equipment, the sensor inducing an electrical current from a sensed magnetic flux passing through a permeable wall of the enclosure. The magnetic flux is provided by a magnetic field generator within the enclosure. The generator is connected to the equipment to generate the field when the circuitry is operating correctly whereby the indicator shows a correct state of operation. The invention avoids the use of sealed orifices in the enclosure for conductors to pass to exterior LEDs or LEDs sealed within the enclosure and possible resultant leakage. The invention is useful for optical network units. The invention also includes a visual indicating device of multi-layer configuration and a method of visually indicating the operational state of circuitry.

26 Claims, 4 Drawing Sheets

VISUAL INDICATION EQUIPMENT OPERATION

FIELD OF THE INVENTION

This invention relates to visual indication of equipment operation.

BACKGROUND OF THE INVENTION

Electrically operated equipment, i.e. electronic equipment or electrical power equipment, is installed both in outdoor and indoor environments. In both of these environmental situations, it has been found to be convenient and, perhaps, prudent to provide visual indications to show whether the equipment, or parts thereof, are operating correctly and effectively. If properly monitored, visual indicators will inform maintenance technicians immediately when any malfunction of equipment occurs. Visual indicators are used to identify a particular item of equipment which is malfunctioning, as distinct from those which remain functional. Such identification enables necessary repairs or equipment replacement to be effected as soon as possible and with minimal operational downtime. Hence, any customer provided with service by such equipment, e.g. telecommunication service, is indisposed for as short a time as possible by lack of this service due to malfunction.

Visual indication is appropriately provided by an illumination process, e.g. with the use of a light emitting diode (LED) so as to be readily seen as required. Particularly with the use of visual indicators on outside plant equipment, problems are known to arise because of environmental conditions. Illuminated visual indicators protrude through apertures in equipment housings and these apertures, unless properly sealed, allow the surrounding environmental conditions to reach the equipment and detrimentally affect the operation. Thus, the operational parts of equipment, e.g. printed circuit boards, and electrical terminals, may be subjected to humidity conditions in the form of airborne mist or heat condensed droplets of water. Precipitation in any form, especially when wind driven, and extreme temperature changes also may cause operational problems.

In known structures, with LEDs protruding through apertures in housings, the LEDs are either mounted upon printed circuit boards or are connected thereto by electric conductors. The LEDs typically are covered with clear plastic layers or windows, or with glass lens caps. Sealing always presents problems around LEDs mounted in such ways. Sealing is necessary around the covers of the LEDs to prevent moisture ingress into housings. Sealing may also be necessary to prevent electromagnetic or radio frequency transmission into and out of housings with resultant detrimental effects on the operation of equipment both within the housing and outside the housing. Where satisfactory sealing is initially effected with such structures, there is always the possibility of sealing failure during usage, particularly when subjected to outside environmental conditions.

In addition, some structures may be for use underground. For such usage, sealing must be adequate to prevent water ingress when submerged in water and also to withstand extremes of water pressure when water depth increases.

Attempts have been suggested to avoid sealing problems. One suggested attempt involves the incorporation of an LED into an environmentally sealed planar carrier. The LED, circuitry to the LED and the carrier being referred to as a "membrane switch". However, while the LED and circuitry within the switch may be effectively sealed, the switch needs to be mounted upon a housing of equipment with which it is associated and is connected by an electric conductor through the housing to circuitry of the equipment. Problems may exist with sealing an aperture in the housing surrounding the conductor and with sealing the switch to the housing. Also, such sealing may be unreliable after a period of usage especially in outdoor environmental conditions.

It follows that sealing failure may result in malfunction and deterioration in circuitry operation with also the possibility of allowing leaking of electromagnetic and radio frequency transmission through the housing.

SUMMARY OF THE INVENTION

The present invention seeks to avoid or lessen leakage problems and problems caused by the surrounding environment.

Accordingly, the present invention provides electrically operated equipment comprising:

an environmentally sealed enclosure having at least one wall permeable to a magnetic flux;

an electric operated circuitry environmentally protected within the enclosure; and a magnetic field generator within the enclosure and interconnected to the electric circuitry to produce a magnetic flux indicative of a state of operation of the circuitry, the flux after passage through the permeable wall to induce an electric current in a magnetic flux sensor outside the enclosure, and produce a visual indication of the state of operation of the electric circuitry.

As may be seen from the above invention, the enclosure is environmentally sealed and no apertures exist in the enclosure although a visual indication is made possible of the state of operation of the circuitry within the enclosure. Hence, the use of the magnetic flux generator to create a magnetic flux which passes through a permeable wall of the enclosure, avoids any possibility of leakage occurring as no apertures exist or could form during use of the equipment due to seal failure at apertures. Thus, the enclosed circuitry cannot be deleteriously affected by the surrounding environment, e.g. humidity, changes in humidity and temperature changes which could result in condensation of water droplets upon the circuitry. Also precipitation in any form outside the enclosure can have no effect upon the condition and operation of the circuitry.

The use of an induction coupling through the permeable wall provides an aperture free environmentally sealed enclosure in which the environmental sealing is maintained throughout the entire use of the equipment.

The equipment according to the invention may be used with any suitable magnetic flux sensor positioned outside the enclosure in a suitable location. However, in a preferred arrangement, equipment according to the invention includes a magnetic flux sensor to be influenced by the magnetic flux issuing through the permeable wall to induce an electrical current corresponding to the magnetic flux. A visual indicator is electrically connected to the sensor and is controlled by the induced current to produce visual indication of the state of operation of the circuitry.

The equipment according to the invention may comprise an electronic circuitry or a power circuitry, or both.

Conveniently, the magnetic field generator comprises a magnetically permeable core with an electrically conductive coil wound on to it. It is also convenient for the magnetic flux sensor and the visual indicator to be mounted upon the enclosure and for them both to be environmentally sealed.

Advantageously the magnetic flux sensor and visual indicator are environmentally sealed within a multi layer structure with adjacent layers environmentally sealed together. Thus, the multi layer structure may be planar and may be conveniently attached, i.e. by adhesive, to a surface of the enclosure. The invention further includes electrically operated equipment as defined above but having both electrical power circuitry and electronic telecommunication circuitry within the enclosure. Each of these circuitries comprises its own magnetic field generator within the enclosure, and magnetic flux sensor and visual indicator outside the enclosure.

In addition, the invention includes a visual indication device for indicating a state of operation of electrically operated equipment comprising:

a magnetic flux sensor capable of being influenced by a magnetic flux to induce an electrical current in the sensor corresponding to the magnetic flux;

a visual indicator electrically interconnected to the magnetic flux sensor and controllable by the induced electrical current to produce a visual indication of a state of operation of the electrically operated equipment; and a common carrier, the magnetic flux sensor and the visual indicator being environmentally sealed within the common carrier and electrically interconnected within the common carrier.

The invention also includes a method of visually indicating an operational state of an electric circuitry which is environmentally sealed within an environmentally sealed enclosure comprising:

producing a magnetic flux within the enclosure, the magnetic flux indicative of the state of operation of the electric circuitry;

passing the magnetic flux through a permeable wall of the enclosure to the outside of the enclosure; and on the outside of the enclosure, sensing the magnetic flux, inducing the sensed flux into a corresponding electrical current and, with the electrical current, operating a visual indicator to indicate the state of operation of the electric circuitry.

BRIEF DESCRIPTION OF THE DRAWINGS

Embodiments of the invention will now be described, by way of example, with reference to the accompanying drawings, in which.

DESCRIPTION OF PREFERRED EMBODIMENT

The first embodiment, now to be described is concerned with a general electrically operated equipment to show in a general sense, the essence of the invention.

Figure 1:
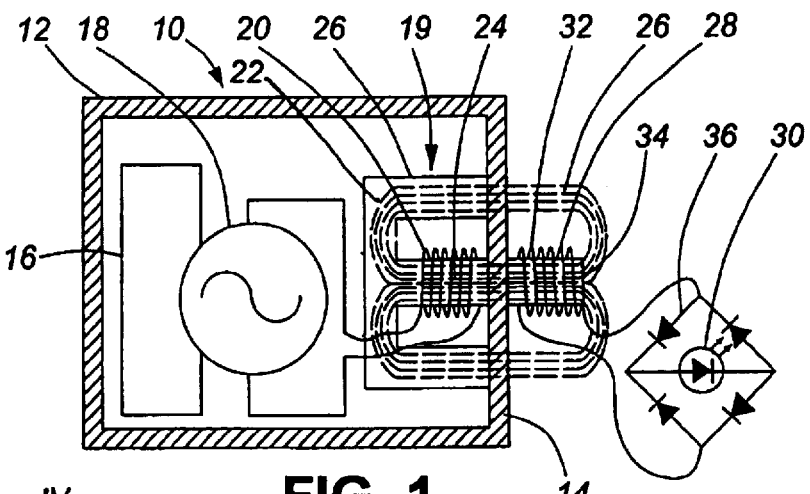
FIG. 1 is a cross-sectional diagrammatic representation of an electrically operated equipment according to a first embodiment.

In the first embodiment, as shown in FIG. 1, electrically operated equipment 10 comprises an environmentally sealed enclosure 12 which necessarily has one wall 14 which is permeable to magnetic flux. The enclosure is formed from a single non-ferrous material for convenience purposes so that, in effect, the whole enclosure is similarly permeable. The enclosure is formed throughout from aluminum, but other non-ferrous metals or other materials of sufficient strength could be used, such as suitable plastics materials, e.g. polycarbonates, polyolefins, or plastic composites, which may include carbon fibers.

Within the enclosure is mounted an electrically operated electronic or power circuitry, generally shown as item 16.

It is required that an operational state of the circuitry 16 may be viewed from outside the enclosure 12 without the enclosure having apertures for either viewing visual indicators mounted in a wall of the enclosure or for the passage of wiring through the enclosure wall.

To enable the outside visual indication to be provided while the enclosure remains permanently environmentally sealed, i.e. without apertures, inductive coupling is provided through the permeable wall 14. This is effected in the following manner.

As shown by FIG. 1, the circuitry 16 is provided with an AC generating source 18 (shown diagrammatically) to which a primary winding, i.e. conductive coil 20, is electrically connected. The coil 20 forms part of a magnetic field generator 19 which includes a magnetically permeable core 22 onto which the coil 20 is wound. The core is shaped, as shown, with a central axial core arm 24 surrounded by a cylindrical wall 26 of the core, the coil 20 surrounding the axial core arm 24. The core 22 is positioned adjacent to the permeable wall 14 to direct flux lines 26 so that they pass through the permeable wall. Hence, unwanted coupling through near field induction in the circuitry 16 is minimized or avoided. On the outside of the enclosure 12 is basically provided a magnetic flux sensor 28 and a visual indicator 30 which may be an LED. The sensor 28 comprises a secondary winding, i.e. conductive coil 32, wound onto a magnetic permeable core 34 (or wound around an air gap not shown). The sensor 28 is positioned on the outside of the permeable wall 14 in axial alignment with the coil 20 so as to be able to sense the magnetic flux passing through the wall 14 and complete an inductive coupling. This coupling provides an electrical current in the coil 32 by mutual inductance. This current is connected to a diode-bridge rectifier 36 which rectifies the current and passes it to the visual indicator 30 so as to illuminate the indicator. In use, the magnetic flux is produced by the magnetic field generator 19 only when the circuitry 16 is operating or is operating correctly. Hence, the visual indicator 30 can only be illuminated during correct operation of the circuitry. If at any time the visual indicator 30 ceases to be illuminated, then steps should be immediately taken to correct the circuitry operation as required, possibly by complete replacement of the enclosure 12 with its contents.

Hence the first embodiment provides a visual indication of the operation of circuitry within the environmentally sealed enclosure 12 without sealed apertures being present in the enclosure.

A second embodiment will now be described and relates to a more specific electrically operated equipment.

Figure 3:
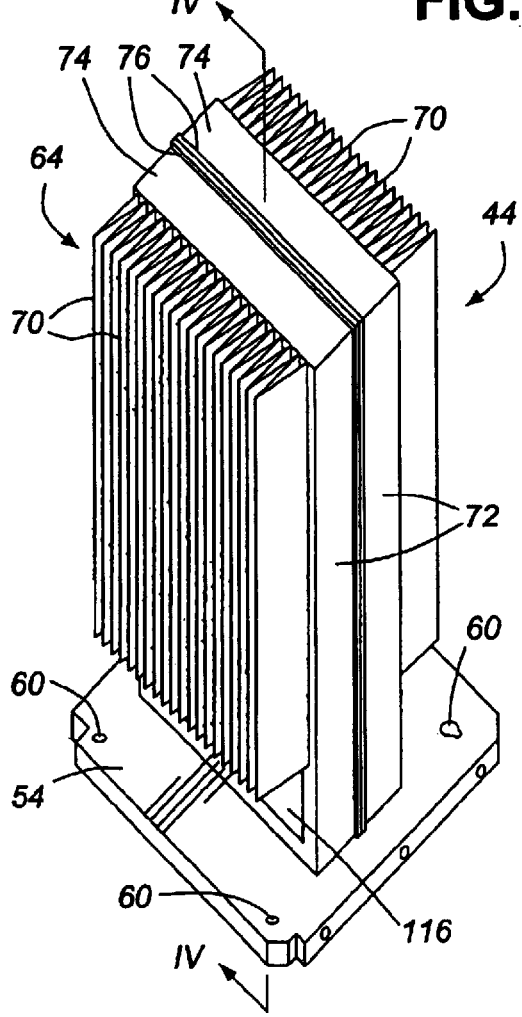
FIG. 3 is a perspective view of an environmentally sealed arrangement forming part of the equipment of the second embodiment.

In the second embodiment, an optical network unit 40 comprises an upper housing 42 (FIG. 2) which encloses an environmentally sealed printed circuit board arrangement 44 (FIG. 3). A lower housing 46 contains a signal in/out arrangement for signal transmission and power transmission to printed circuit boards (to be described) forming part of the arrangement 44. The signal in/out arrangement within the housing 46 is conventionally constructed, is not shown and does not form part of the present invention. However, the lower housing 46 is supplied from beneath with a power cable 48, an optical transmission cable 50, and two electrical transmission cables 52. The optical transmission cable and the power cables, together with one of the electrical transmission cables, connect the optical network unit 40 with a central office (not shown) in conventional manner. The other electrical transmission cable 52 is connected to a customer's premises by means of intermediate equipment (not shown) known by various terms such as joint wiring interconnect, outside wiring interface, serving area interconnect or feeder distribution interface.

The upper and lower housings 42 and 46, together with the printed circuit board arrangement 44, are mounted upon a planar horizontal housing mount 54, shown more clearly in FIG. 3. A carrier 56 for the optical network unit to attach the network unit to a rigid vertical post 58 is also attached to the housing mount 54.

Figure 2:
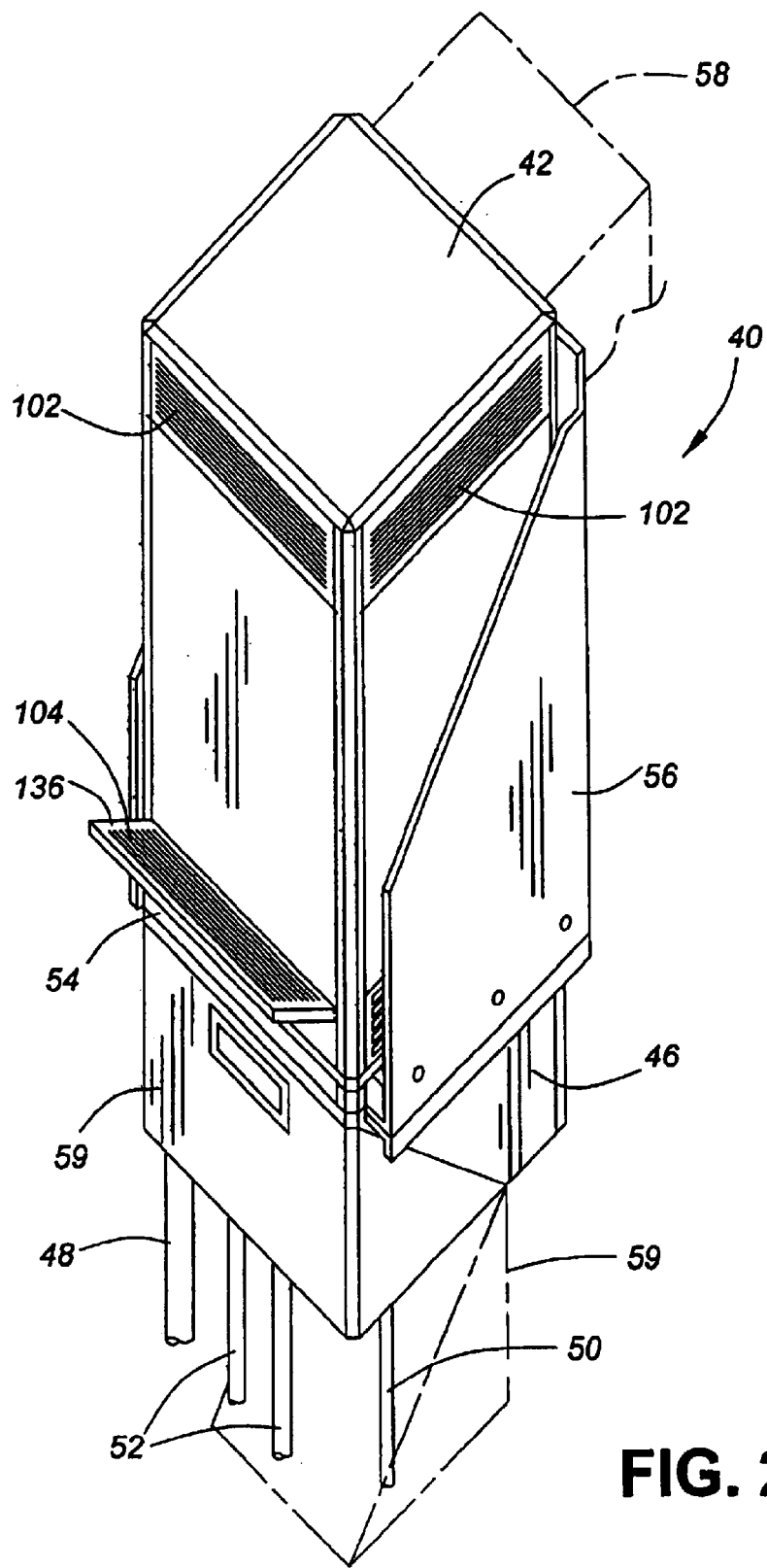
FIG. 2 is a perspective view of an electrically operated equipment according to a second embodiment.

A door 59 at the front of the lower housing 46 may be dropped to a chaindotted position shown in FIG. 2 for access to terminal connections (not shown) of the signal in/out arrangement, and also for access to protectors (not shown). Access into the lower compartment also enables screws (not shown) to be reached, the screws to remove the upper housing 42 passing through holes 60 in the housing mount 54 (FIG. 3) to remove the upper housing 42 and also to enable screws 62 to be removed (FIGS. 4 and 5) for removal of the printed circuit board arrangement 44.

Figure 4:
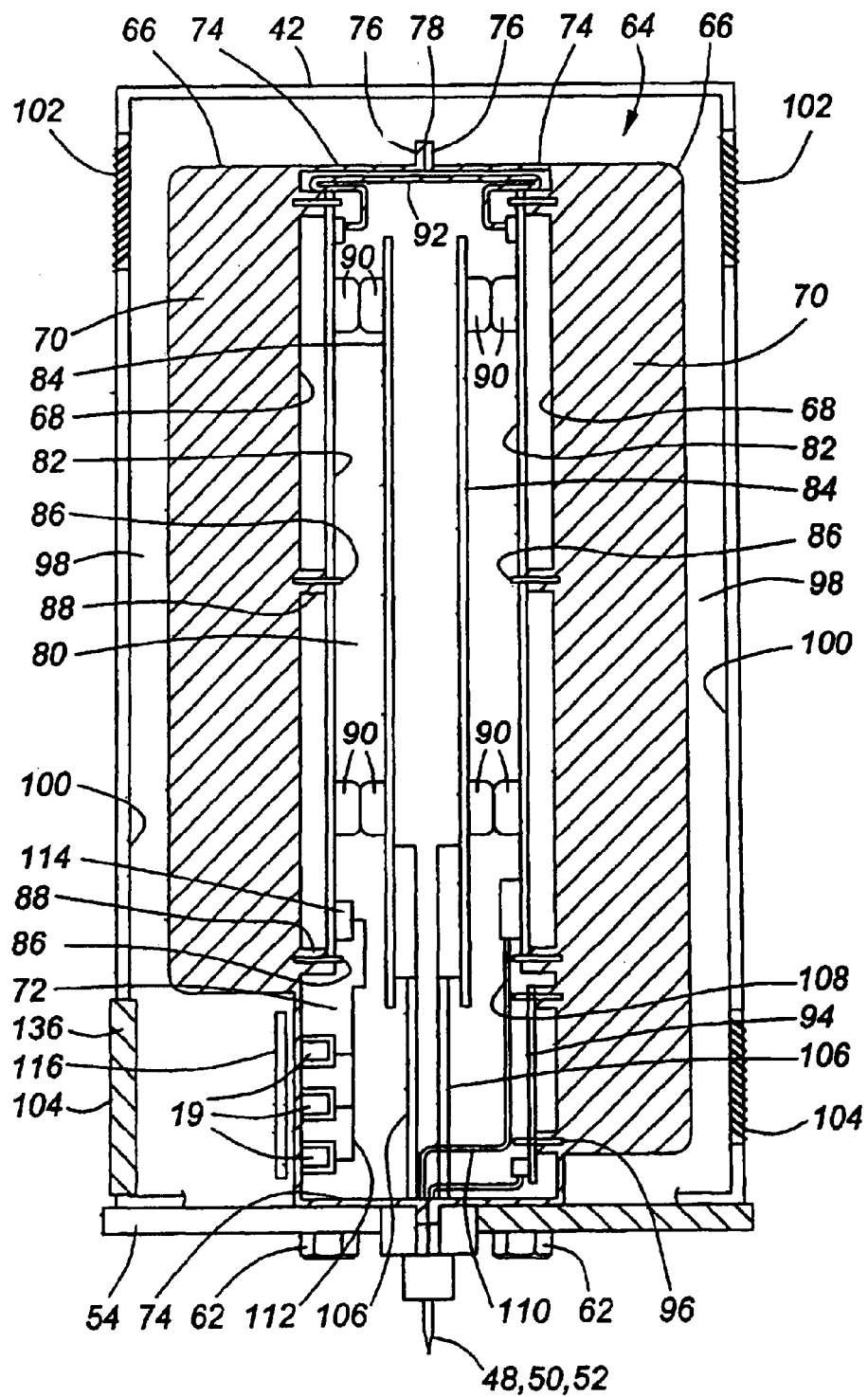
FIG. 4 is a sectional view of the arrangement of FIG. 3 taken along line IV—IV in FIG. 3 and showing a surrounding housing.
Figure 5:
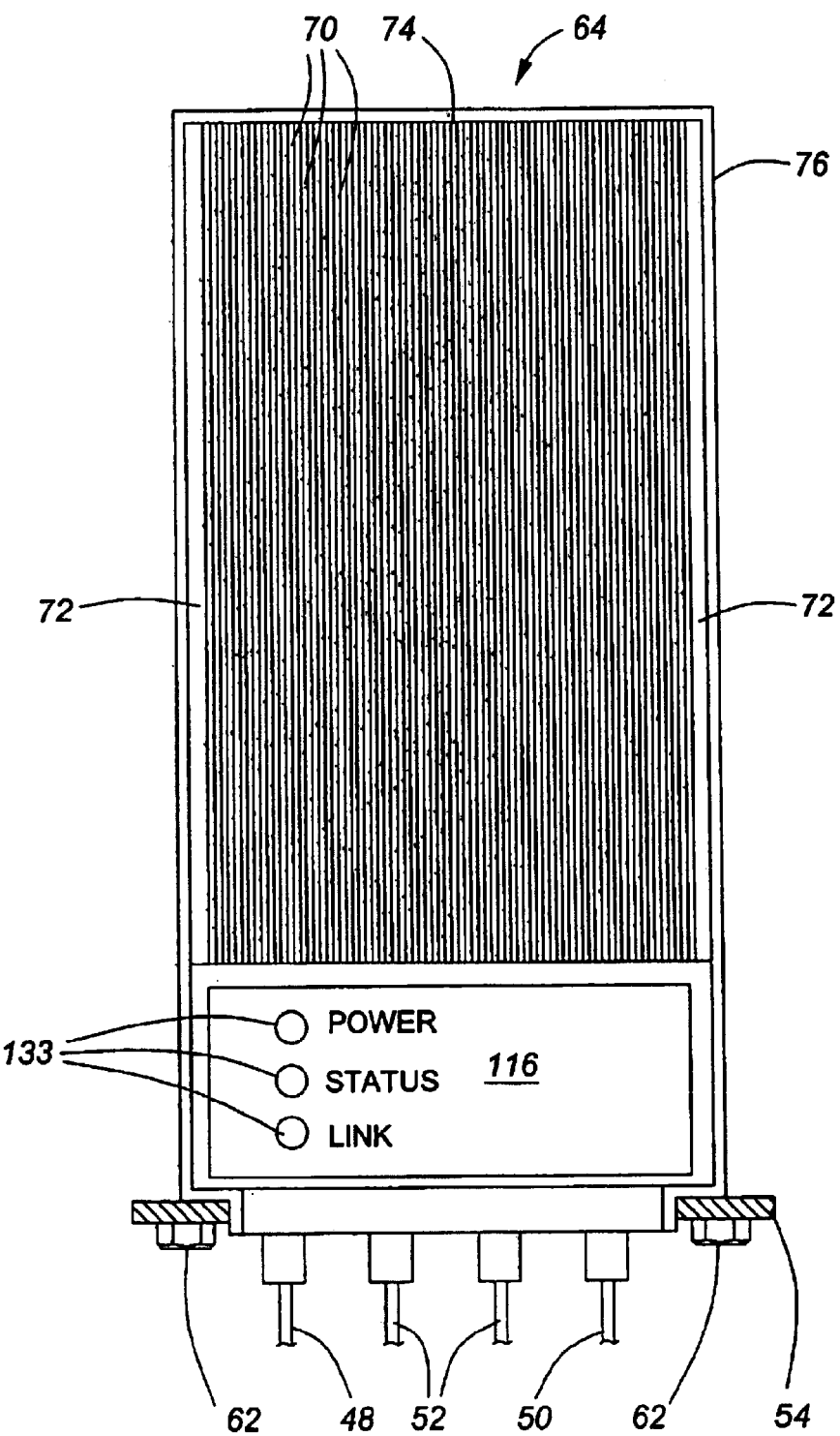
FIG. 5 is a front view of the environmentally sealed arrangement.

As shown particularly by FIGS. 4 and 5, the arrangement 44 comprises an environmentally sealed enclosure 64 within which a plurality of printed circuit boards or line cards are environmentally protected. The enclosure 64 comprises two enclosure halves 66, each of which has a finned main wall 68, the fins 70 being vertical heat exchange fins. From one side of the main wall 68 extend two long vertical side walls 72. Two relatively short top and bottom walls 74 extend between and are joined to the side walls 72. Free ends of the walls 72 and 74 define a rectangular opening and terminate in a continuous outwards flange 76, surrounding the opening.

The two enclosure halves 66 are secured together at the free ends of side, top and bottom walls with an environmental and EMI seal 78 disposed between free ends of the walls and between the flanges 76. Screws (not shown) pass from flange to flange 76 to hold the enclosure halves 66 assembled with the seal 78 compressed between them. An environmentally sealed chamber 80 is thus formed between the halves 66.

The chamber 80 houses four printed circuit boards 82 and 84 to provide the required electronic function of the unit 40. The printed circuit boards are assembled onto the two enclosure halves 66 before these are secured together. A board 82 is secured to the main wall 68 of each half 66 by heat conductive screws 86. These pass through the printed circuit board 82 in heat conductive relationship to a ground plane (not shown) of the board and into the associated wall 68. Each printed circuit board 82 is spaced from its associated wall 68 by heat conductive spacers 88 surrounding the screws 86. The screws 86 are disposed in horizontally spaced vertical rows across the board 82, one vertical row of three screws being shown for each board in FIG. 4. All of the screws 86 are aligned, each vertically with an associated fin 70, and extend into the bases of the fins to shorten the heat exchange paths into the fins.

Each printed circuit board 82 has a spaced and parallel printed circuit board 84 attached to it, each board 82 joined to its board 84 by connectors 90 between top and bottom end regions of the board.

A flexible ribbon cable or flex circuit 92 connects top end regions of the printed circuit boards 82 and a power board 94 is secured to the main wall 68 in the lower regions of one of the enclosure halves 66. Screws 96 holding the power board in place extend into bases of the fins 70, as shown by FIG. 4.

The enclosure 64, as in the first embodiment, is formed from aluminum which is a suitable heat exchange material for conducting heat from the printed circuit boards into the fins 70. However, other suitable heat exchange materials may be used which, for the purposes of the embodiment and the invention, must be non-ferrous. To preserve the surface of the enclosure 64 in all types of environmental conditions, it is subjected to the known irriditing process followed by a protective paint coating, such as polyurethane.

The fins 70 extend from both front and rear surfaces of the enclosure 64 (see FIG. 4) into airflow passages 98 defined between the enclosure and the inner surfaces of sides 100 of the upper housing member 42. Upper and lower air vents 102, 104, (FIG. 2) in the sides 100, enable cooling air to pass upwardly through the airflow passages 98 by convection to extract the heat from the fins during use of the equipment.

As shown in FIGS. 4 and 5, two electrical cables 106 extend through the bottom wall 74 of the enclosure 64, together with an optical cable 108 and a power cable 110, which are sealed into position within the bottom wall to maintain the environmental seal. These cables are interconnected by connectors (not shown) within the lower housing 46 to the appropriate cables 48, 50 and 52, discussed above. As shown by FIG. 4, the cables 106 are connected to the lower ends of the printed circuit boards 84, the optical cable 108 to one of the boards 82 and the power cable 110 to the lower end region of the power board 94.

As in the first embodiment, the optical network unit is provided with at least one magnetic field generator and corresponding magnetic flux sensor and visual indicator. In fact, in this embodiment three magnetic field generators are provided. These generators 19 are of similar construction to those discussed in the first embodiment and further description is therefore not required. The three generators 19 are connected by electrical conductors 112 and connectors 114 into circuitry at a lower end region of the forwardly facing enclosure half 66 with the generators spaced in line vertically and secured to the inside surface at the lower end of the main wall 68. One of the connectors 114 is connected into part of the circuitry which is concerned with power operation of the equipment, while a second of the connectors is connected into part of the circuitry concerned with operation of the electronic circuitry. The third connector 114 is connected in a line which bypasses the electronic and power circuitry and is directly connected to the power and transmission lines coming into the enclosure 64.

On the outside of the enclosure 64, each of the generators 19 is provided with a corresponding magnetic flux sensor and corresponding visual indicator, as will now be described.

Figure 6:
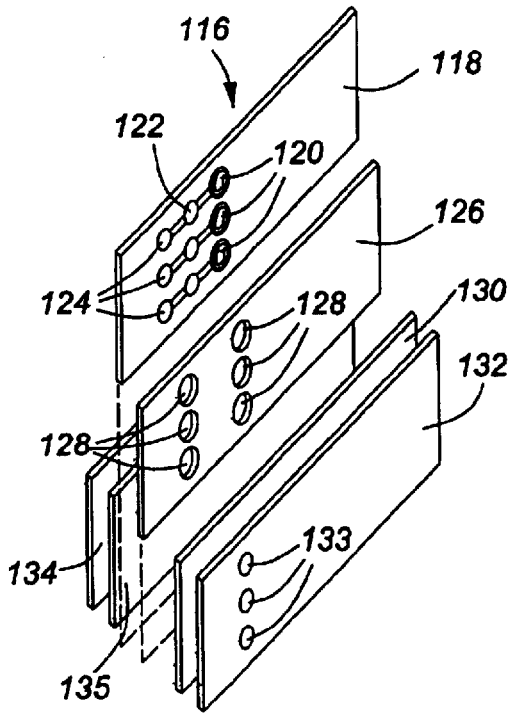
FIG. 6 is an exploded isometric view of a visual indicator arrangement carried by a multi layer carrier.

As shown particularly in FIG. 6, there is provided a visual indication device 116 which is of laminate construction. Of its multi layers, an inner layer 118 carries three magnetic flux sensors, each of the sensors being a conductive coil 120 surrounding an air core, although this could be a permeable core. The coils 120 are disposed upon the layer 118 in positions so as to align themselves, one with each of the generators 19 when the visual indication device 116 is secured in position on an outside surface of the enclosure 64, as will be described. Each of the coils 120 is electrically interconnected with a diode-bridge rectifier 122 which lies intermediate the coil 120 and a visual indicator in the form of a forwardly facing LED 124.

Both the bridge rectifier and the LED are mounted on the inner layer 118 so that electrical interconnection also takes place on this layer. Forwardly of the inner layer 118 is disposed a spacer layer 126 having apertures 128 to accommodate the forward projection of the coils 120 and the LEDs 124 from the layer 118. The spacer layer 126 is attached to the inner layer 118 by adhesive. Forwardly of the spacer layer 126 is an environmental seal layer 130 and a front layer 132. The front layer is attached to the spacer layer 126 by the seal layer 130. Both the spacer and front layers are transparent in regions 133 directly in front of the LEDs 124. Behind the inner layer 118 is disposed a further spacer layer 135 and a support layer 134, the layers 118, 134 and 135 being adhesively secured together. The visual indication device structure is environmentally sealed to prevent environmental conditions from affecting the performance of any of the operational features carried upon the inner layer 118. Further, the layers of the structure are permeable to magnetic flux and are conveniently formed from suitable plastics materials, such as polyurethanes and polypropylene with non-ferrous materials being absent. The visual indication device 116 is adhesively attached below fins 70 to the outside surface of the main wall 68 of the front enclosure half, (FIGS. 4 and 5), with the coils 120 suitably aligned with their corresponding magnetic field generators 19. This surface of the enclosure half is planar for attachment purposes.

In use, with the optical network unit operating correctly, then each of the LEDs is illuminated. The visual indication device 116 lies directly behind the front lower vent 104, which is provided by an upwardly hinged door 136 in the upper housing 42. In FIG. 2, the door 136 is shown in an upward position. Thus, inspection of the LEDs may be performed as required. The door is provided with a tamper-proof lock (not shown) to prevent unauthorised personnel from obtaining entry.

As will be seen from FIG. 5, a graphic overlay is provided upon the front layer of the visual indication device. This shows that the upper and central LEDs are the visual indicators for the power and electronic circuitries respectively, and in which the electronic circuitry is represented by the term "STATUS". The lower LED is shown as "LINK" which is concerned with the operation of the incoming optical transmission lines.

In use, with the optical network unit operating correctly, an AC source provides current to each generator 19 to create a magnetic field, the flux lines of which pass through the lower part of the front main wall 68. The flux lines are sensed individually by the coils 120 to induce electrical currents. The currents, after being rectified by the rectifiers 122, illuminate the LEDs 124.

If the "LINK" LED is not illuminated at any time during use, then this indicates that there is a failure in cable connectivity between the optical network unit 40 and the central office over the optical transmission lines. This may indicate a problem with the optical transmission cable external to the optical network unit 40, or a problem internal to the optical network unit, i.e. with the electronics. If the power LED is not illuminated, this indicates the optical network unit is not receiving power or is not receiving sufficient power to operate. This may indicate a problem external to the optical network unit in the external power node or OSP power feed pairs, or an internal failure in the optical network unit, i.e. in the power board 94. If the "STATUS" LED is not illuminated, this indicates the optical network unit is not in an operational state. The problem may reside either with software configuration parameters or with failed electronics, within the arrangement 44.

If any of the three LEDs is not illuminated, diagnostic actions are required by maintenance personnel. If it is then ascertained the problem lies within the arrangement 44, this requires removal and replacement with an operational arrangement 44. Removal and replacement of the arrangement 44 to correct any of the above three non-operational situations, firstly requires the upper housing 42 to be removed from the housing mount 54 with the door 59 open and disconnections are made to all the cables into the arrangement 44. The arrangement 44 is then removed by first removing the screws 62 and a replacement and operational arrangement 44 is added to the optical network unit.

As may be seen, therefore, a visual indication may be provided of any activity within the environmentally sealed arrangement 44, while avoiding apertures in the enclosure for visually positioning LEDs or for conductors extending to exterior LEDs, such apertures being difficult to seal on a permanent basis.

In a modification of the second embodiment, the circuitry may be arranged such that instead of the LEDs failing to be illuminated when a circuitry problem occurs a dual LED is installed for each LED. The message sent from the internal circuitry is such as to alter the color of any dual LED, e.g. from green (indicating correct operation) to red to show that there is indeed a circuitry problem.

What is claimed is:

1. An electrically operated equipment comprising:
    an environmentally sealed enclosure having at least one wall permeable to inductive magnetic flux;
    an electric circuitry environmentally protected within the enclosure; and
    a magnetic field generator within the enclosure and interconnected to the electrically operated circuitry to produce a magnetic flux indicative of a state of operation of the circuitry, the flux, after passage through the permeable wall, to induce an electrical current in a magnetic flux sensor outside the enclosure, and produce a visual indication of the state of operation of the electric circuitry.

2. The electrically operated equipment comprising:
    an environmentally sealed enclosure having at least one wall permeable to magnetic flux;
    an electric circuitry environmentally protected within the enclosure;
    a magnetic field generator within the enclosure and interconnected to the electric circuitry for producing a magnetic flux indicative of a state of operation of the electric circuitry, said magnetic flux to pass through the permeable wall;
    a magnetic flux sensor positioned outside the enclosure to be influenced by the magnetic flux, thereby to induce an electrical current corresponding to the magnetic flux; and
    a visual indicator positioned outside the enclosure and electrically connected to the sensor and controllable by the electrical current to produce a visual indication of the state of operation of the electric circuitry.

3. The electrically operated equipment according to claim 2, wherein the electric circuitry comprises an electronic circuitry.

4. The electrically operated equipment according to claim 2, wherein the electric circuitry comprises a power circuitry.

5. The electrically operated equipment according to claim 2, wherein the magnetic field generator comprises a magnetically permeable core with an electrically conductive coil wound onto the core.

6. The electrically operated equipment according to claim 2, wherein the magnetic flux sensor and the visual indicator are mounted upon the enclosure.

7. The electrically operated equipment according to claim 2, wherein the magnetic flux sensor and the visual indicator are both environmentally sealed.

8. The electrically operated equipment according to claim 2, wherein the magnetic flux sensor and the visual indicator are both sealed within a common carrier and are electrically interconnected for electrical current transmission within the common carrier.

9. The electrically operated equipment according to claim 8, wherein the magnetic flux sensor comprises an electrically conductive coil.

10. The electrically operated equipment according to claim 9, wherein the electrically conductive coil of the magnetic flux sensor is wound around a permeable core.

11. The electrically operated equipment according to claim 9, wherein the electrically conductive coil of the magnetic flux sensor is wound around an air core.

12. The electrically operated equipment according to claim 8, wherein the common carrier has a front and a rear and comprises a multi-layer structure with the adjacent layers environmentally sealed together, and with the magnetic flux sensor and the visual indicator each carried by an inner layer of the multi-layer structure, and with the visual indicator visible, when operated, from in front of the common carrier.

13. The electrically operated equipment according to claim 12, wherein the visual indicator projects forwardly from a front surface of its carrier layer and a spacer inner layer is attached adhesively to the front surface of the carrier layer, the spacer layer defining a space into which the visual indicator extends.

14. The electrically operated equipment according to claim 12, wherein the magnetic flux sensor projects in at least one direction away from its carrier layer and a spacer inner layer is attached adhesively to the appropriate surface of the carrier layer, the spacer inner layer defining a space into which the magnetic flux sensor extends.

15. The electrically operated equipment according to claim 12, wherein the multi-layer structure comprises a support layer positioned rearwardly of the magnetic flux sensor and the visual indicator.

16. An electrically operated equipment comprising:
an environmentally sealed enclosure having at least one wall permeable to a magnetic flux;
electric circuitry comprising electronic telecommunications circuitry and electrical power circuitry environmentally protected within the enclosure;
each circuitry having an individual magnetic field generator within the enclosure, each individual magnetic field generator interconnected to its associated circuitry for producing a magnetic flux indicative of a state of operation of the associated circuitry, said magnetic flux to pass through the permeable wall;
an individual magnetic flux sensor associated with each magnetic field generator, each magnetic flux sensor positioned outside the enclosure to be influenced by the magnetic flux from the associated magnetic field generator to induce an electrical current corresponding to the magnetic flux; and
an individual visual indicator associated with each magnetic flux sensor, each visual indicator positioned outside the enclosure, electrically connected to the associated magnetic flux sensor and controllable by the electrical current induced at its sensor to produce a visual indication of the state of operation of the associated electric circuitry.

17. The electrically operated equipment according to claim 16, wherein all magnetic flux sensors and all visual indicators are environmentally sealed within a common carrier and each visual indicator is electrically connected to its associated magnetic flux sensor for signal transmission within the common carrier, the common carrier being permeable to the magnetic flux to enable each magnetic flux sensor to sense the magnetic flux from its associated magnetic flux generator.

18. A visual indication device for indicating a state of operation of electrically operated equipment comprising:
a magnetic flux sensor capable of being influenced by a magnetic flux to induce an electrical current in the sensor corresponding to the magnetic flux;
a visual indicator electrically interconnected to the magnetic flux sensor and controllable by the induced electrical current to produce a visual indication of a state of operation of the electrically operate equipment; and
a common carrier, the magnetic flux sensor and the visual indicator being environmentally sealed within the common carrier and electrically interconnected within the common carrier.

19. The device according to claim 18, wherein the magnetic flux sensor comprises an electrically conductive coil.

20. The device according to claim 19, wherein the electrically conductive coil of the magnetic flux sensor is wound around a permeable core.

21. The device according to claim 19, wherein the electrically conductive coil of the magnetic flux sensor is wound around an air core.

22. The device according to claim 18, wherein the common carrier has a front and a rear and comprises a multi-layer structure with adjacent layers of the structure environmentally sealed together, and with the magnetic flux sensor and the visual indicator each carried by an inner layer of the multi-layer structure, and with the visual indicator visible, when operated, from in front of the common carrier.

23. The device according to claim 22, wherein the visual indicator projects forwardly from a front surface of its carrier layer and a spacer inner layer is attached adhesively to the front surface of the carrier layer, the spacer layer defining a space into which the visual indicator extends.

24. The device according to claim 22, wherein the magnetic flux sensor projects in at least one direction away from its carrier layer and a spacer inner layer is attached adhesively to the appropriate surface of the carrier layer, the spacer inner layer defining a space into which the magnetic flux sensor extends.

25. The device according to claim 22, wherein the multi-layer structure comprises a support layer positioned rearwardly of the magnetic flux sensor and of the visual indicator.

26. A method of visually indicating an operational state of an electric circuitry which is environmentally sealed within an environmentally sealed enclosure comprising:
producing a magnetic flux within the enclosure, the magnetic flux indicative of the state of operation of the electric circuitry;
passing the magnetic flux through a flux permeable wall of the enclosure, to the outside of the enclosure; and
on the outside of the enclosure, sensing the magnetic flux, inducing the sensed flux into a corresponding electrical current and, with the electrical current, operating a visual indicator to indicate the state of operation of the electric circuitry.

* * * * *